(12) United States Patent
Sakaguchi et al.

(10) Patent No.: US 7,854,366 B2
(45) Date of Patent: Dec. 21, 2010

(54) METHOD OF MOUNTING CONDUCTIVE BALL AND CONDUCTIVE BALL MOUNTING APPARATUS

(75) Inventors: Hideaki Sakaguchi, Nagano (JP); Kiyoaki Iida, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 144 days.

(21) Appl. No.: 12/188,556

(22) Filed: Aug. 8, 2008

(65) Prior Publication Data
US 2009/0072011 A1  Mar. 19, 2009

(30) Foreign Application Priority Data
Sep. 14, 2007  (JP) ............... 2007-239045

(51) Int. Cl.
  B23K 31/00  (2006.01)
  B23K 31/02  (2006.01)
(52) U.S. Cl. ............ 228/180.22; 228/245; 228/33; 228/41; 438/612; 438/116; 438/119
(58) Field of Classification Search .......... 438/612, 438/116, 119; 228/180.22, 245, 33, 41
See application file for complete search history.

(56) References Cited

U.S. PATENT DOCUMENTS 6,191,022 B1 *  2/2001  Creswick ............ 438/612

2003/0029908 A1 *  2/2003  Suzuki et al. .......... 228/180.22
2007/0052112 A1     3/2007  Bauer et al. ............ 257/786

FOREIGN PATENT DOCUMENTS

| JP | 2004-186286 A1 | 7/2004 |
| JP | 2005-056901 | 3/2005 |
| JP | 2005-158944 | 6/2005 |
| JP | 2005158944 A * | 6/2005 |
| JP | 2006-173195 A1 | 6/2006 |
| JP | 2007-507866 | 3/2007 |
| WO | WO 2007123384 A1 * | 11/2007 |

OTHER PUBLICATIONS

JP2005158944 English translation.*
Japanese Office Action dated Sep. 29, 2009.

* cited by examiner

Primary Examiner—Kiley Stoner
Assistant Examiner—Erin B Saad
(74) Attorney, Agent, or Firm—Kratz, Quintos & Hanson, LLP

(57) ABSTRACT

A method of mounting a conductive ball according to the present invention includes the steps of, disposing a mask on a substrate including connection pads, the mask having opening portions corresponding to the connection pad, supplying conductive balls on the mask, arranging the conductive balls on the connection pad of the substrate through the opening portions of the mask by moving the conductive balls to one end side of the mask by ball moving member (a brush), and removing excess conductive balls remaining on a region of the mask where the opening portions are provided, by bonding the excess conductive balls to a ball removal film (adhesive film).

6 Claims, 17 Drawing Sheets

METHOD OF MOUNTING CONDUCTIVE BALL AND CONDUCTIVE BALL MOUNTING APPARATUS

CROSS-REFERENCE TO RELATED APPLICATIONS

This application is based on and claims priority of Japanese Patent Application No. 2007-239045 filed on Sep. 14, 2007, the entire contents of which are incorporated herein by reference.

BACKGROUND OF THE INVENTION

1. Field of the Invention

The present invention relates to a method of mounting a conductive ball and a conductive ball mounting apparatus, more particularly, a method of mounting a conductive ball and a conductive ball mounting apparatus, for mounting a conductive ball on a wiring substrate or the like to form a bump electrode.

2. Description of the Related Art

In the prior art, there has been a method of forming a solder ball on a connection pad of a wiring substrate on which a semiconductor chip or the like is to be mounted, and thereby forming a bump electrode. In such a method of mounting a solder ball, firstly, as shown in FIG. 1A, a wiring substrate 100 on which solder balls are to be mounted is prepared. In the wiring substrate 100, connection pads 200 are provided on an upper surface of a substrate 110, and a solder resist 300 in which opening portions 300a are provided on the connection pads 200 is formed. Moreover, a flux 400 is coated on the connection pads 200.

Then, as shown in FIG. 1B, a mask 500 to be used for mounting solder balls is disposed on the wiring substrate 100. The mask 500 has a configuration in which a mesh portion 540 is attached to a periphery of a metal mask portion 520, and in which a frame portion 560 is provided on the outer edge of the mesh portion 540. Moreover, opening portions 500a through which solder balls pass are formed in parts of the mask portion 520, the parts corresponding to the connection pads 200 of the wiring substrate 100.

Next, as shown in FIG. 1B similarly, a large number of solder balls 600 are supplied onto the mask 500 and then swept to move to one end side of the mask 500 by a brush 700. Thereby, as shown in FIG. 1C, the solder balls 600 pass through the opening portions 500a of the mask 500 and are arranged to be bonded to the fluxes 400 on the connection pads 200 of the wiring substrate 100. Thereafter, the mask 500 is moved upward to be removed from the wiring substrate 100.

Otherwise, as shown in FIG. 2, there is another method using an air supply 750 instead of the use of the brush 700. In this method, by blowing air to the solder balls 600 from an air supply 750 to move the solder balls 600 to one end side of the mask 500, the solder balls 600 is arranged on the connection pads 200 of the wiring substrate 100 while causing the solder balls 600 to pass through the opening portions 500a of the mask 500.

As the techniques related to the above-described methods of mounting a solder ball, in Patent Literature 1 (Japanese Patent Application Publication No. 2004-186286), it is set forth that, a print mask is disposed on a silicon substrate having columnar electrodes, then a large number of solder balls are supplied on the print mask, then air is moderately blown to the solder balls while a squeegee is moved, thereby, solder balls pass through the print mask, and are arranged on the columnar electrodes.

Also, in Patent Literature 2 (Japanese Patent Application Publication No. 2006-173195), it is set forth that, a large number of solder balls are supplied on a mask disposed on a wafer, then the solder balls are moved by a filling head provided with a sweep member, to arrange the solder balls in opening portions in the mask, then the solder balls remaining on the mask are swept to the outside of the mask by a removal head provided with a soft squeegee, and are removed consequently.

In the above-described prior arts, the solder balls 600 the number of which is considerably larger than that of the opening portions 500a of the mask 500 are supplied on the mask 500. Accordingly, although some of the solder balls 600 pass through the opening portions 500a of the mask 500, some other solder balls 600 remain around the opening portions 500a of the mask 500 in many cases. Such being the case, it is necessary to move the excess solder balls 600 to one end side of the mask 500, or to remove the excess solder balls 600 from the mask 500.

Without this operation, the excess solder balls 600 remaining on the mask 500 may pass through the opening portions 500a of the mask 500 when the mask 500 is moved upward from the wiring substrate 100 to be separated therefrom, and consequently, multiple solder balls are likely to be mounted on the connection pads 200 of the wiring substrate 100, in some cases.

In the method in which the excess solder balls on the mask are moved by the brush, the brush needs to be moved repeatedly with many times in order to remove all the excess solder balls. Consequently, a long time is required for the operation, and, hence, the manufacturing efficiency is low. Furthermore, solder balls sometimes adhere to the brush, which is likely to complicate the maintenance.

In the method in which the excess solder balls on the mask are moved by using air, the wind pressure needs to be set relatively high in order to efficiently move the solder balls. As a result, solder balls on the mask sometimes fly to the outside of the mask in some cases. By contrast, when the wind pressure is set low enough to prevent solder balls from flying to the outside, it is extremely difficult to move all the excess solder balls.

SUMMARY OF THE INVENTION

It is an object of the present invention to provide a method of mounting a conductive ball and a conductive ball mounting apparatus which are capable of mounting conductive balls with high reliability while efficiently removing excess conductive balls on a mask, in a method for mounting the conductive balls on a substrate through the mask.

The present invention provides a method of mounting a conductive ball. The method includes the steps of: disposing a mask on a substrate including connection pads, the mask having opening portions corresponding to the connection pads; supplying conductive balls on the mask; arranging the conductive balls on the connection pad of the substrate through the opening portion of the mask, by moving the conductive balls to one end side of the mask by a ball moving member; and removing excess conductive balls remaining on a region of the mask where the opening portions are provided, by bonding the excess conductive balls to a ball removal film.

In the method of mounting a conductive ball of the present invention, firstly, a mask is disposed on a substrate (such as a wiring substrate, or a semiconductor wafer in which semiconductor element is made) having connection pads, the mask having opening portions corresponding to the connection pads. Thereafter, a larger number of conductive balls (solder balls or the like) than that of the opening portions are supplied on the mask.

Then, the conductive balls are swept and moved to one end side of the mask by moving ball moving member (a brush or the like) in a horizontal direction. Thereby, the conductive balls pass through the opening portions of the mask, and are arranged respectively on the connection pads of the substrate. At this stage, some of the conductive balls remain as excess in regions in which the opening portions are formed, on the mask.

Subsequently, the excess conductive balls on the mask are bonded to a ball removing film (such as an adhesive film or an electrostatic adsorption film), thereby the excess conductive balls are removed from the mask consequently.

In the present invention, unlike the prior arts, makes it possible collectively to remove the excess conductive balls by using the ball removal film without moving the brush repeatedly until no excess conductive balls remain on the mask. Accordingly, the manufacturing efficiency can be remarkably improved. Moreover, unlike a method in which the conductive balls are moved by blowing air, no conductive balls can fly to the outside since the conductive balls are bonded to the adhesive film and are then removed.

In addition, since no excess conductive balls remain around the opening portions of the mask, this method prevents the excess conductive balls from being mounted on the substrate through the opening portions of the mask when the mask is moved upward to be removed from the substrate. Accordingly, a single conductive ball can be mounted on each of the connection pads of the substrate with high reliability.

According to one preferred mode of the present invention, the ball removal film is placed in parallel with the mask in a state that a roll-like film is pulled out. After the conductive balls adhere to the ball removal film and are then removed, a used part of the film is wound, and a new part of the ball removal film is placed on the mask.

In the present invention described above, a protrusion portion protruding upward may be provided on an upper surface of the mask. According to this mode, even when the ball removal film is displaced closer to the mask, the protrusion portion serves as a stopper, so that the height position of the ball removal film is controlled to be a desired position. Thus, only the excess conductive balls on the mask are selectively removed in a stable manner without removing the conductive balls passing through the opening portions of the mask.

As described above, in the present invention, conductive balls can be mounted on a substrate with high reliability while excess conductive balls on the mask are removed efficiently.

DETAILED DESCRIPTION OF THE PREFERRED EMBODIMENTS

Description will be given below of embodiments of the present invention with reference to the accompanying drawings.

First Embodiment

Figure 10:
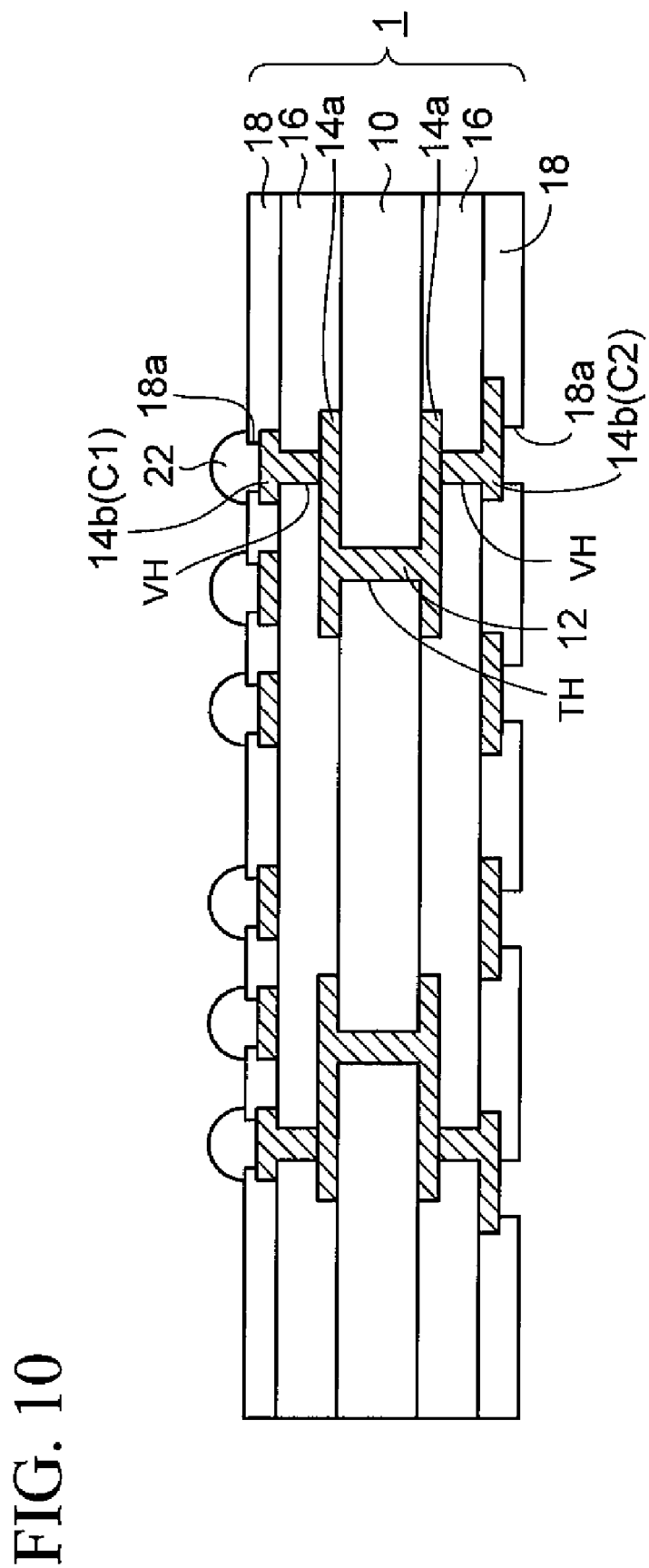
FIG. 10 is a cross-sectional view (No. 1) showing a method for mounting a semiconductor chip on a wiring substrate on which conductive balls are mounted.
Figure 11:
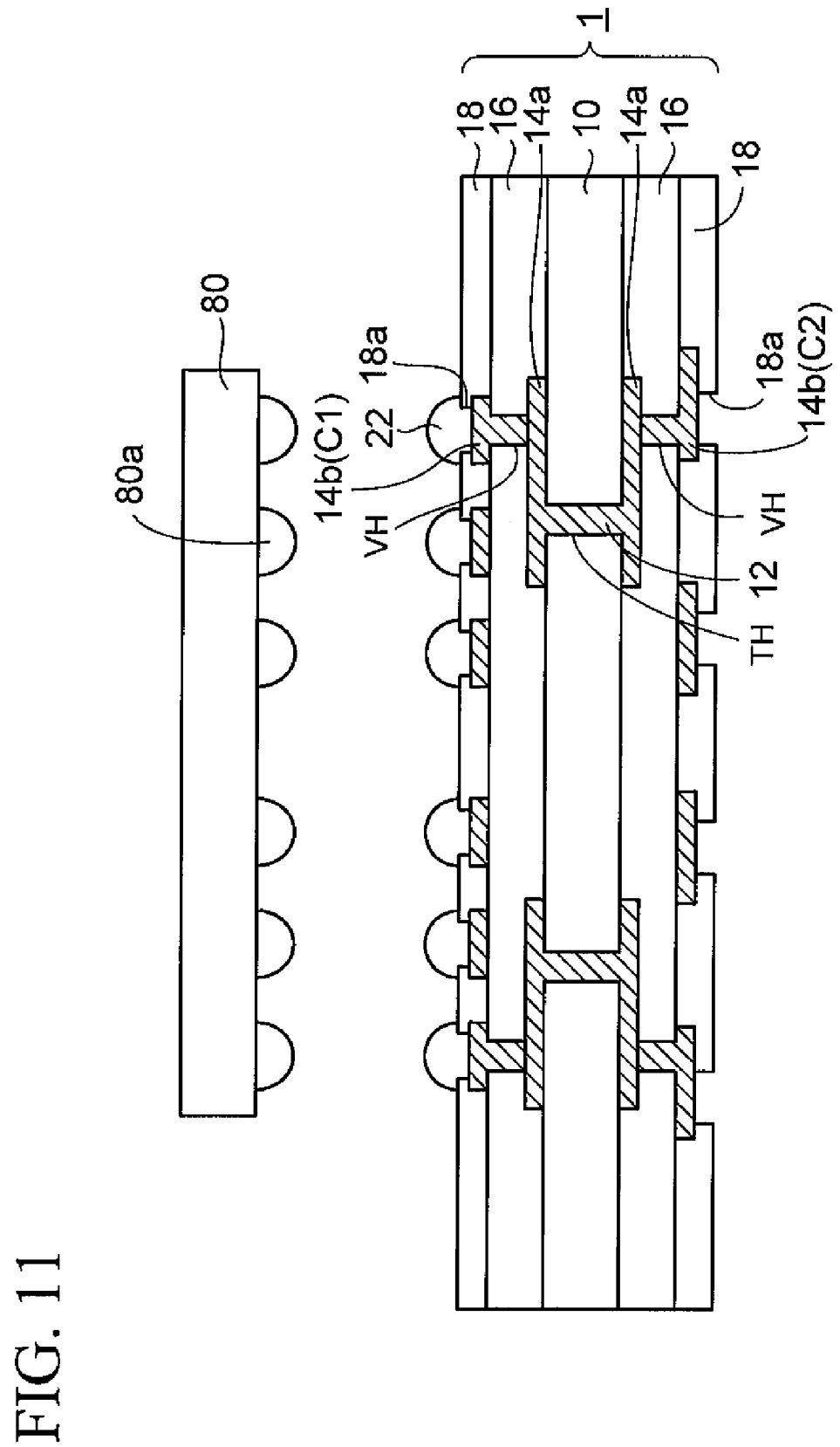
FIG. 11 is a cross-sectional view (No. 2) showing the method for mounting a semiconductor chip on a wiring substrate on which conductive balls are mounted.
Figure 12:
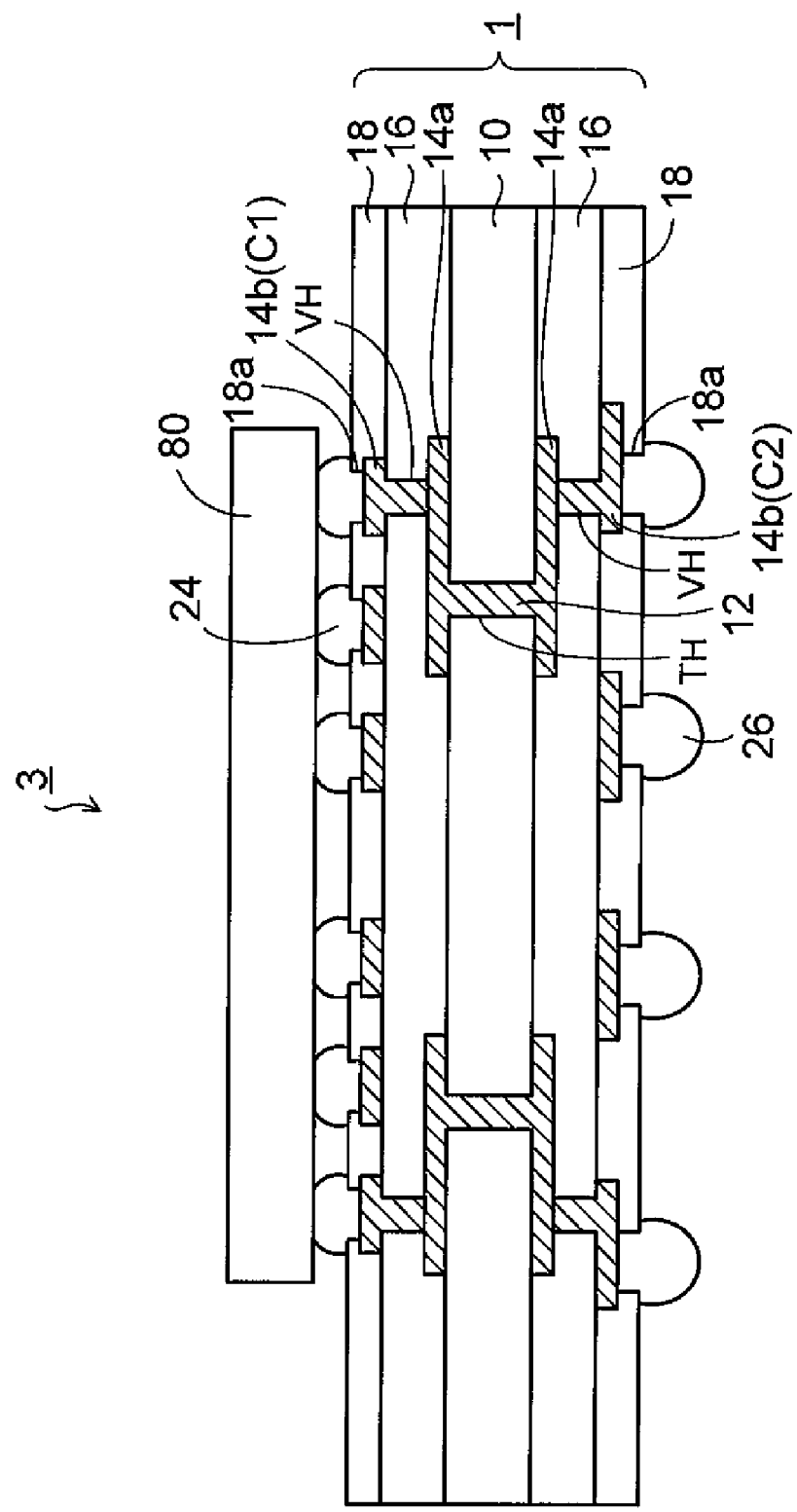
FIG. 12 is a cross-sectional view (No. 3) showing the method for mounting a semiconductor chip on a wiring substrate on which conductive balls are mounted.
Figure 13:
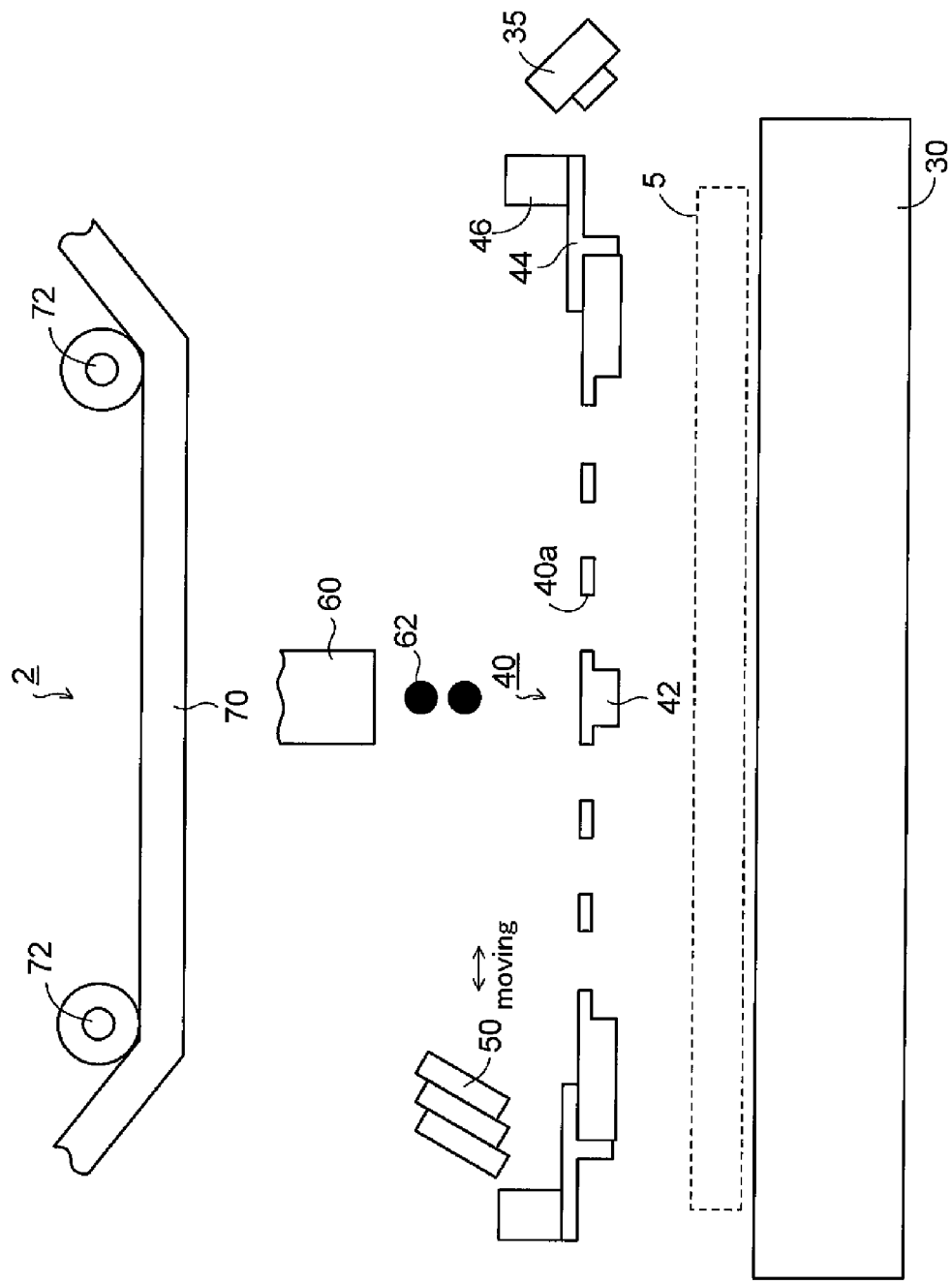
FIG. 13 is a cross sectional view showing a conductive ball mounting apparatus according to the first embodiment of the present invention.

FIGS. 3 to 9 are cross-sectional views showing a method of mounting a conductive ball, according to a first embodiment of the present invention; FIGS. 10 to 12 are cross-sectional views showing a method of mounting a semiconductor chip on a wiring substrate on which conductive balls are mounted; and FIG. 13 is a cross-sectional view showing a conductive ball mounting apparatus similarly.

Figure 1A:
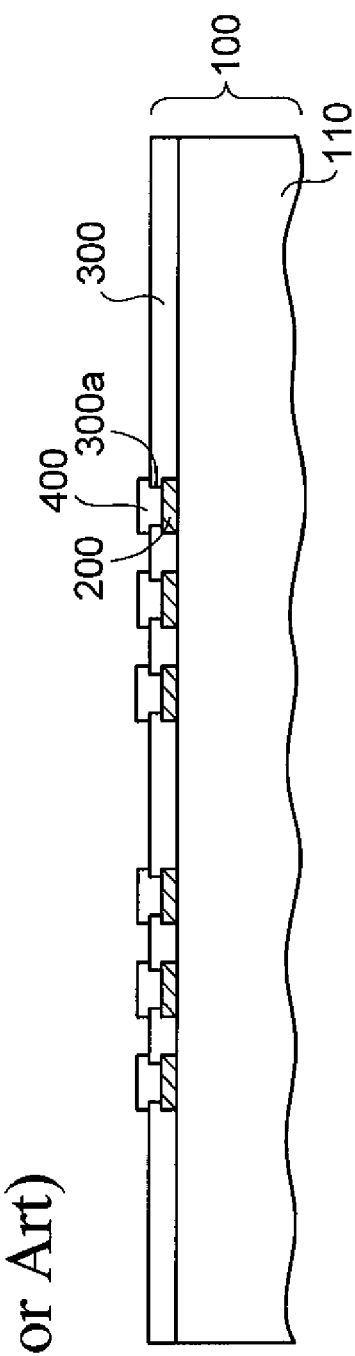
FIGS. 1A to 1C are cross-sectional views showing a method (first method) of mounting a conductive ball, according to the prior art.
Figure 1B:
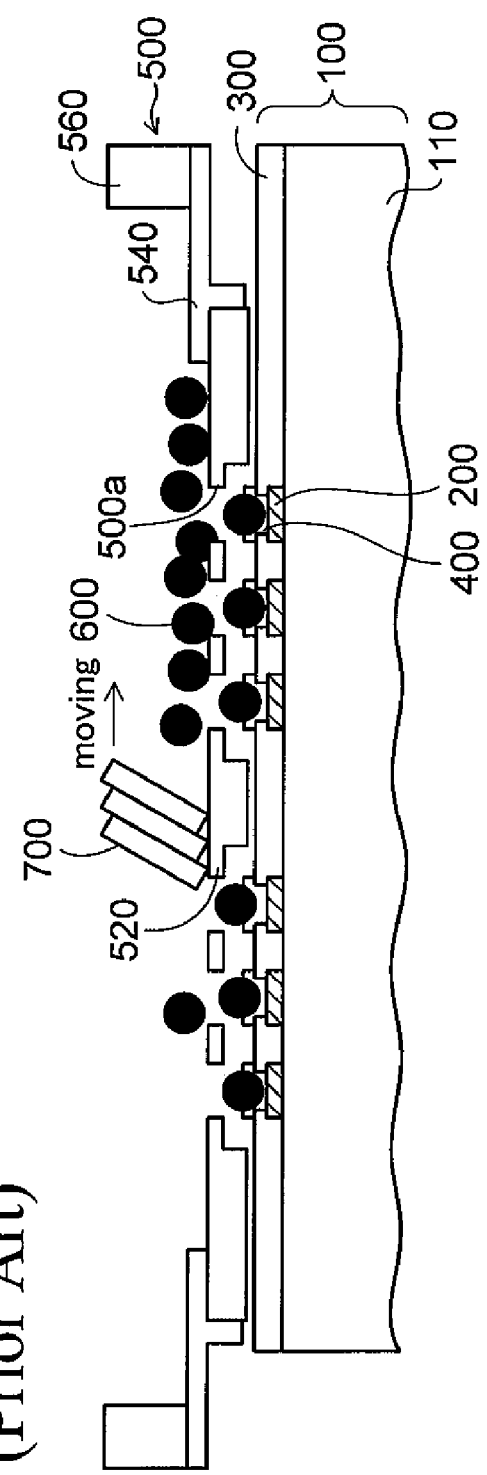
Figure 1C:
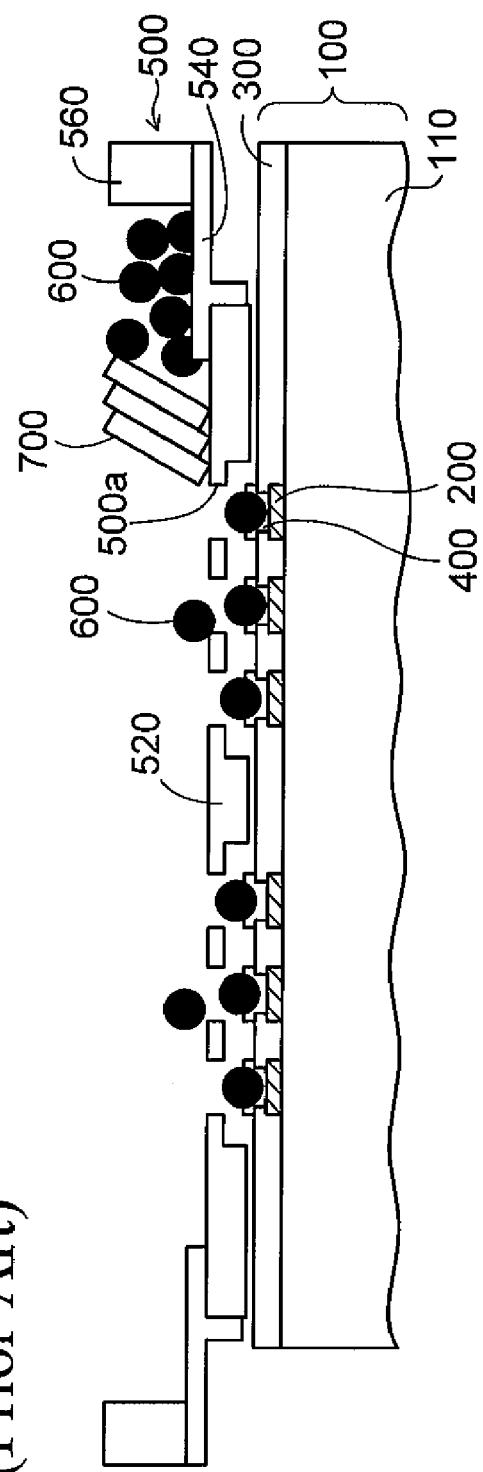
Figure 2:
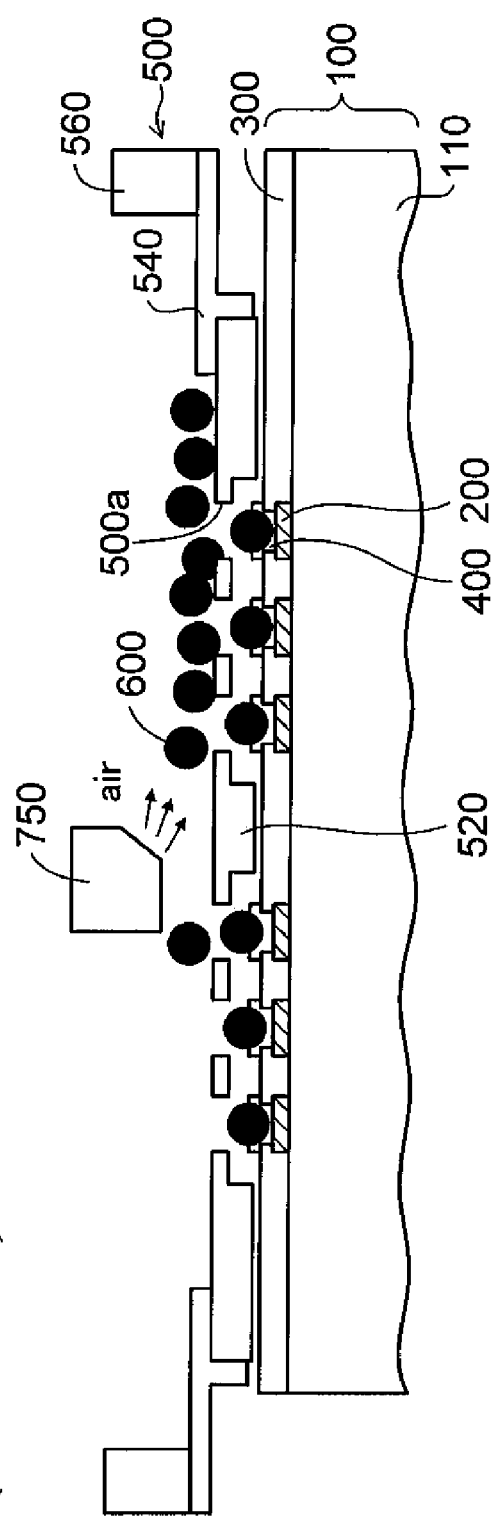
FIG. 2 is a cross-sectional view showing a method (second method) of mounting a conductive ball, according to the prior art.
Figure 3:
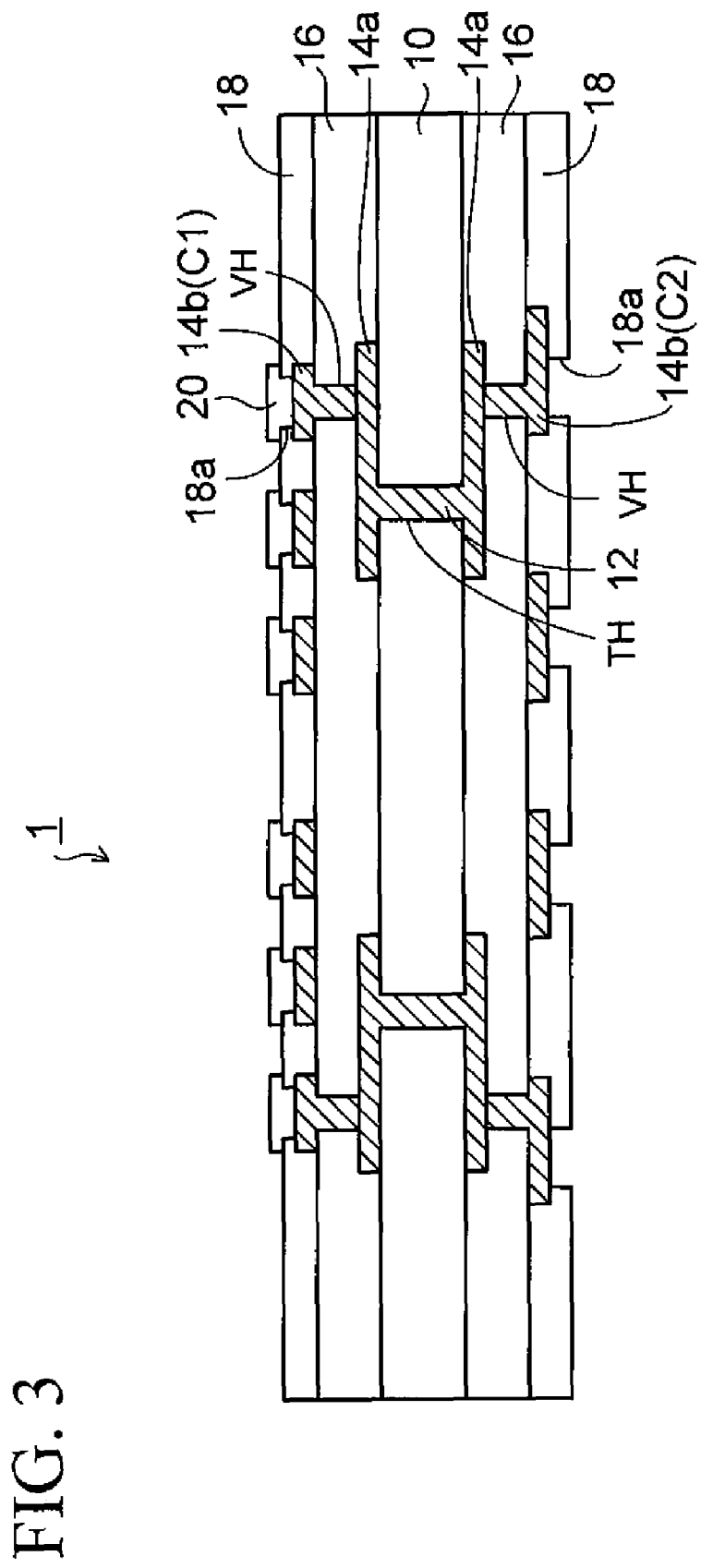
FIG. 3 is a cross-sectional view (No. 1) showing a method of mounting a conductive ball, according to a first embodiment of the present invention.

In the method of mounting a conductive ball, according to the first embodiment, firstly, as shown in FIG. 3, a wiring substrate 1 on which conductive balls are to be mounted is prepared. In the wiring substrate 1, through holes TH are formed in a core substrate 10 made of glass epoxy resin or the like, and the through holes TH are filled respectively with through-hole electrodes 12 made of copper or the like. In addition, first wiring layers 14a connected to each other via through-hole electrode 12 and made of copper, are respectively formed on both surfaces of the core substrate 10.

Alternatively, the first wiring layers 14a which are formed on the both surfaces of the core substrate 10, may be connected to each other with a through-hole plated layer formed on an inner wall of the through holes TH, and the opening in the through holes TH may be filled with resin.

On the both surfaces of the core substrate 10, interlayer insulating films 16 for covering the first wiring layers 14a are formed respectively. The interlayer insulating films 16 are formed by affixing resin films made of epoxy, polyimide or the like to the core substrate 10, for example.

In the interlayer insulating layers 16 on the both surfaces of the core substrate 10, via holes VH having a depth which reaches the first wiring layer 14a are formed respectively. Moreover, on the interlayer insulating layers 16 on the both surfaces of the core substrate 10, the second wiring layers 14b connected to the first wiring layers 14a through the via holes VH are formed respectively. In FIG. 3, connection pads C1 and C2 are shown as the second wiring layers 14b.

A solder resist 18 in which an opening portion 18a is provided on each of the connection pads C1, C2 is formed on the second wiring layers 14b on both surfaces of the core substrate 10 respectively. In addition, fluxes 20 are formed respectively on the connection pads C1 of the second wiring layers 14b on the upper surface of the core substrate 10. The fluxes 20 are coated to be patterned on the connection pads C1 of the second wiring layers 14b by means of printing or a dispenser.

Here, a rigid substrate is given as an example of the wiring substrate 1. However, a flexible wiring substrate, which uses a film as a substrate, may be used as the wiring substrate 1.

Alternatively, as a substrate (work) on which the conductive balls are to be mounted, instead of the wiring substrate 1, a semiconductor wafer (silicon wafer) on which a semiconductor element (a transistor or the like) and multilayer wiring layers connected to the semiconductor element are formed and connection pads are provided on an uppermost layer, may be used. Such semiconductor wafer is diced after the conductive balls are mounted on the connection pads thereof, thereby an individual semiconductor chip such as a CPU, a memory, or the like is obtained.

Next, a conductive ball mounting apparatus for mounting a conductive ball on the connection pad C1 of the second wiring layers 14b on the upper surface of the wiring substrate 1 shown in FIG. 3 will be explained hereunder. As shown in FIG. 13, a conductive ball mounting apparatus 2 according to the first embodiment includes a stage 30 for placing a substrate 5, and the substrate 5 is fixed on the stage 30 by vacuum contact or the like. Moreover, the conductive ball mounting apparatus 2 also includes a mask 40 having opening portions 40a through which conductive balls pass. The mask 40 is disposed above the substrate 5.

The mask 40 is composed of a metal mask portion 42 in which opening portions 40a are formed, a mesh portion 44 which is provided on a periphery of the metal mask portion 42, and which is made of resin or the like, and a frame portion 46 which is provided on the outer edge of the mesh portion 44. The mask 40 is connected to moving means (not illustrated), and is thereby capable of moving in the vertical directions and horizontal directions with high accuracy.

Furthermore, the conductive ball mounting apparatus 2 includes ball supply portion 60 for supplying conductive balls 62, and the ball supply portion 60 is disposed above the mask 40. The conductive ball mounting apparatus 2 also includes a brush 50 (ball moving member) for sweeping and moving the large number of conductive balls 62 supplied on the mask 40 in the horizontal directions. The brush 50 is disposed above the mask 40.

The brush 50 is connected to moving means (not illustrated), and is thereby capable of moving in the vertical directions and horizontal directions. The brush 50 is made to abut to the mask 40, and is then moved in a horizontal direction. Thereby, the conductive balls 62 on the mask 40 are transferred into the opening portions 40a of the mask 40.

Here, the brush 50 is given as an example of the ball moving member. However, a cylindrical brush may be moved while rotating, or a plate-like squeegee may be employed. Alternatively, the ball supply portion 60 and the ball moving member (brush 50) may be integrally provided.

Moreover, the conductive ball mounting apparatus 2 of the first embodiment further includes an adhesive film 70 (ball removing film) which removes to bond the excess conductive balls 62 remaining on the mask 40 after the conductive balls 62 are swept into the opening portions 40a of the mask 40. The adhesive film 70 is disposed above the mask 40.

The adhesive film 70 is conveyed by means of a reel-to-reel system. Specifically, a roll-like film wound onto a reel (not illustrated) provided at one end side is pulled out, and is then wound onto a reel (not illustrated) provided at the other end side in a state that the film is pulled to a lower side of the two rollers 72. The rollers 72 or the like are connected to moving means (not illustrated), and are thereby capable of moving in the vertical directions and horizontal directions with high accuracy.

By this matter, the adhesive film 70 is disposed to be controlled at a predetermined height position from on the mask 40. Also the adhesive film 70 between the two rollers 72 is set to have a size corresponding to that of the area of the mask 40, the area in which the plural opening portions 40a are arranged. The adhesive film 70 is disposed in parallel with the mask 40. Thereafter, the excess conductive balls 62 on the mask 40 are bonded to the adhesive film 70, and the adhesive film 70 is then moved upward. Thereby, the excess conductive balls 62 are removed from the mask 40.

Then, the adhesive film 70 is wound onto the reel at the other end side, and the rollers 72 rotate. Thereby, the adhesive film 70 on which the conductive balls 62 are boned is moved, so that a new part of adhesive film 70 is placed under the two rollers 72.

Here, the adhesive film 70 is given as an example of the ball removing film. However, an electrostatic adsorption film, which adsorbs the conductive balls 62 thereon by static electricity, may be employed. Thus, any kind of films can be employed as long as being capable of bonding the conductive balls 62 thereto and removing the conductive balls consequently.

Furthermore, the conductive ball mounting apparatus 2 also includes an image recognition camera 35 which recognizes an alignment mark provided on the substrate 5, and thus has an alignment function to align such that the opening portions 40a of the mask 40 are disposed respectively above the connection pads of the substrate 5, on the basis of recognizing the alignment mark on the substrate 5.

Figure 4:
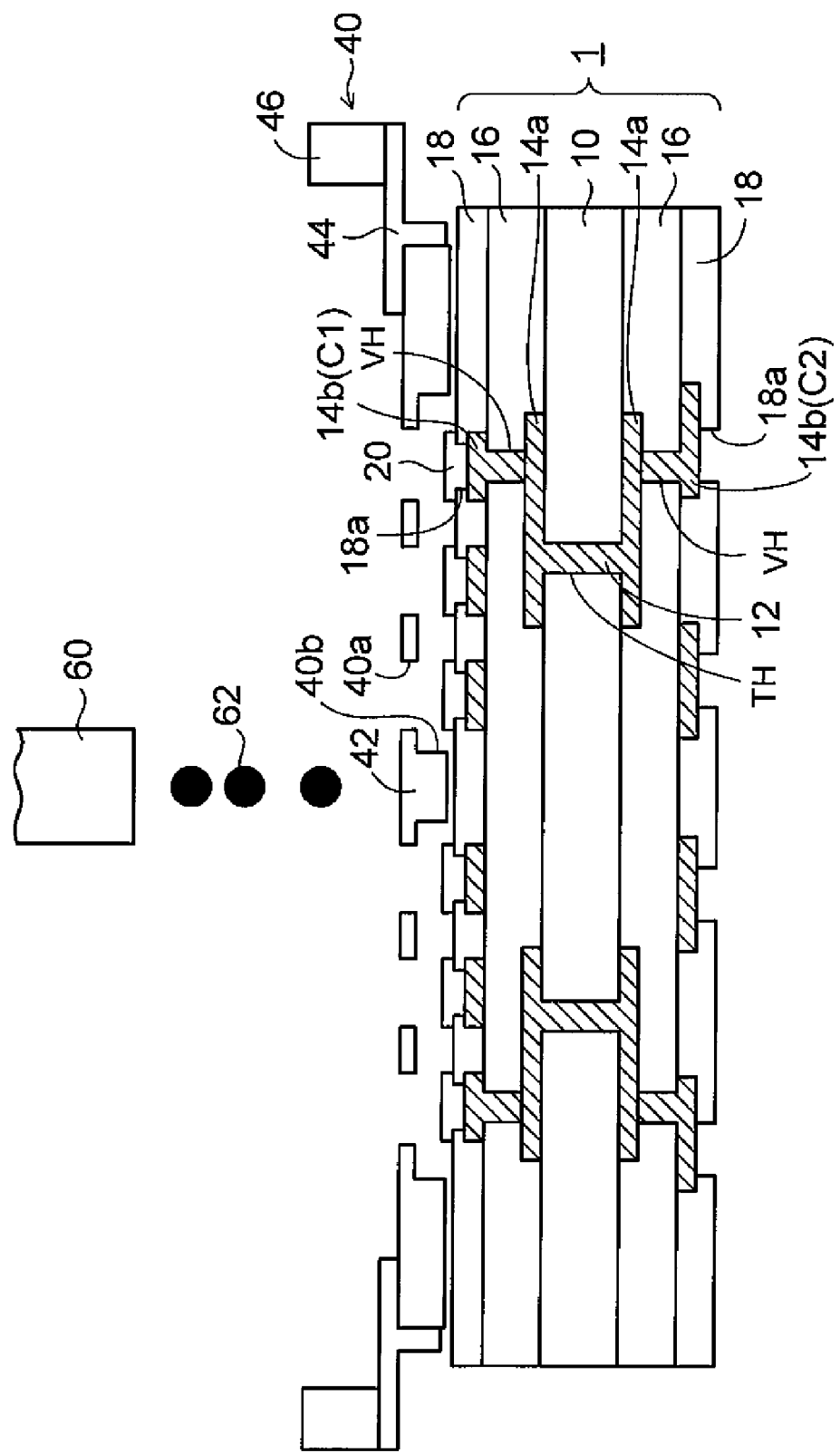
FIG. 4 is a cross-sectional view (No. 2) showing the method of mounting a conductive ball, according to the first embodiment of the present invention.

Next, a method of mounting a conductive ball on the connection pads C1 of the above-described wiring substrate 1 (FIG. 3) by using the conductive ball mounting apparatus 2 described above will be explained hereunder. As shown in FIG. 4, firstly, the wiring substrate 1 is fixed to be placed on the upper surface of the stage 30 (omitted in FIG. 4) of the conductive ball mounting apparatus 2 shown in FIG. 13.

Then, the mask 40 having the opening portions 40a described above is disposed on the wiring substrate 1. In this event, the image recognition camera 35 (FIG. 13) described above recognizes the alignment mark of the wiring substrate 1. Thereby, the mask 40 is aligned with the wiring substrate 1 so that the opening portions 40a of the mask 40 can correspond to the connection pads C1 of the wiring substrate 1 respectively.

In addition, a collective recessed portion 40b is provided in the lower portion of the mask 40, the lower portion corresponding to an area where the connection pads C1 of the wiring substrate 1 are arranged with an area array type. Thereby the mask 40 is prevented from coming in contact with the fluxes 20 on the connection pads C1 of the wiring substrate 1.

Subsequently, as shown in FIG. 4, the conductive balls 62 are supplied on the mask 40 from the ball supply portion 60. The number of the supplied conductive balls 62 is considerably larger than that of the opening portions 40a (corresponding to the connection pads C1 of the wiring substrate 1) of the mask 40.

In the first embodiment, a mode in which a semiconductor chip is flip-chip connected to the connection pads C1 of the wiring substrate 1 is illustrated. In such a case, as the conductive balls 62, solder balls entirely made of solder, balls composed of a core ball and a solder layer covering the outer surface of the core ball, or balls composed of a core ball made of copper and a solder layer covering the outer surface of the core ball, or the like are used. The conductive balls made of various conductive materials can be used depending on the usage of the substrate (work) on which conductive balls are mounted.

Moreover, in the first embodiment, the conductive balls 62 are set to have a diameter of 100 μm or less (the lower limit is 10 μm or more, for example). That is, the conductive balls 62 having a relatively small diameter, that a handling thereof is difficult in a method in which all conductive balls are mounted collectively by an adsorption tool or the like, are used. Here, when the diameter of the conductive balls 62 is 100 μm, for example, a pitch between the connection pads C1 of the wiring substrate 1 is 200 μm (line:space=100:100 μm).

Figure 5:
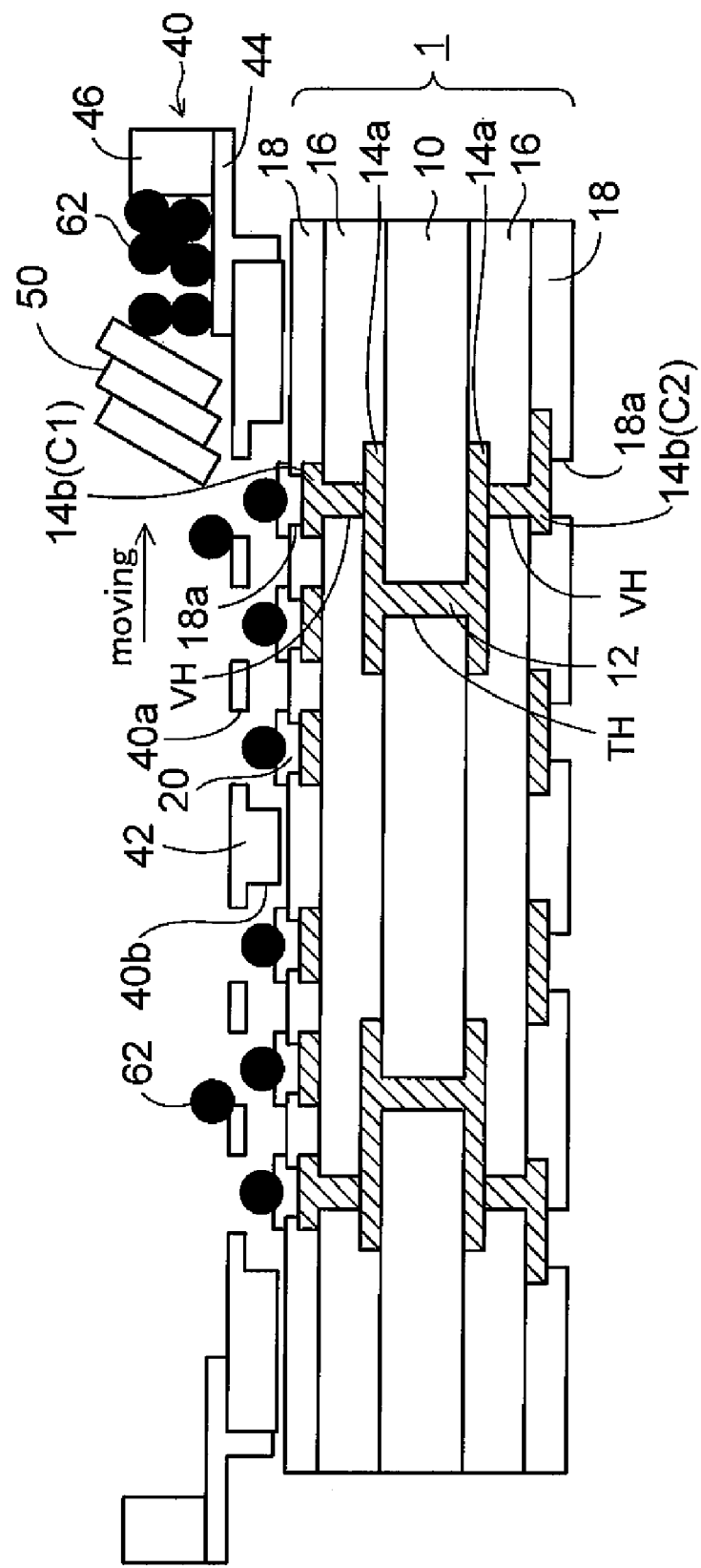
FIG. 5 is a cross-sectional view (No. 3) showing the method of mounting a conductive ball, according to the first embodiment of the present invention.

Then, as shown in FIG. 5, the large number of conductive balls 62 are moved to be swept to one end side of the mask 40 (outside the product area) by the brush 50 (ball moving member). In this event, the conductive balls 62 moved by the brush 50 are transferred into the opening portions 40a of the mask 40 by the brush, and are arranged to be bonded respectively to the fluxes 20 on the connection pads C1 below the opening portions 40a.

The opening portions 40a of the mask 40 are set to have a size slightly larger than that of the conductive balls 62. Accordingly, the conductive balls 62 can easily pass through the opening portions 40a of the mask 40. In this manner, one of the conductive balls 62 is transferred into each of the opening portions 40a of the mask 40 respectively, and is arranged on the connection pad C1 of the wiring substrate 1 below the mask 40.

Also in this event, even if the large number of the conductive balls 62 are moved to the one end side of the mask 40 by the brush 50, some of the conductive balls 62 remain in the regions in which the plural opening portions 40a are arranged (around the opening portions 40a), on the mask 40. In order to prevent the conductive balls 62 from remaining around the opening portions 40a of the mask 40, the brush 50 needs to be moved repeatedly with many times. Consequently, a long time is required for the operation, and hence, the manufacturing efficiency is low.

Figure 6:
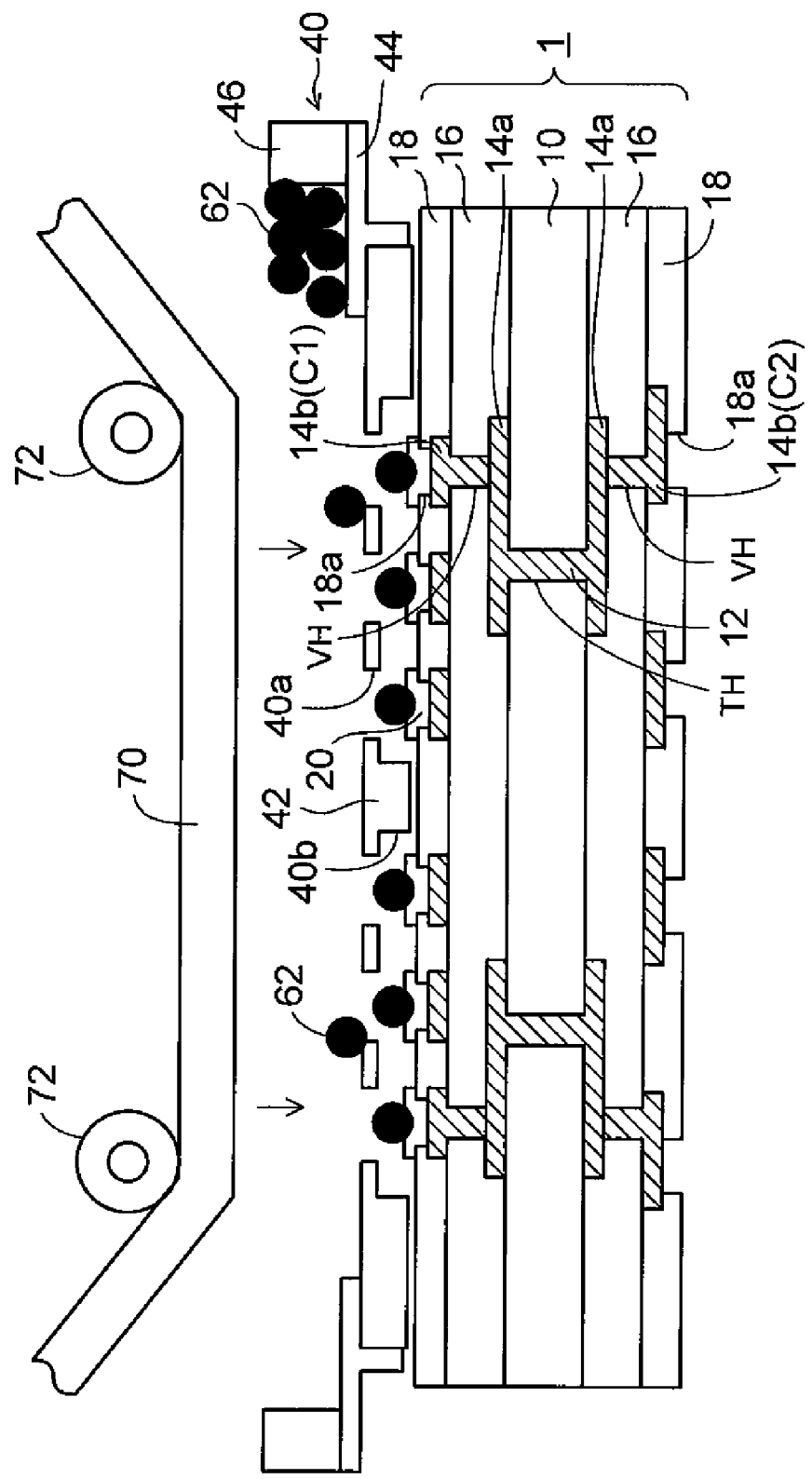
FIG. 6 is a cross-sectional view (No. 4) showing the method of mounting a conductive ball, according to the first embodiment of the present invention.
Figure 7:
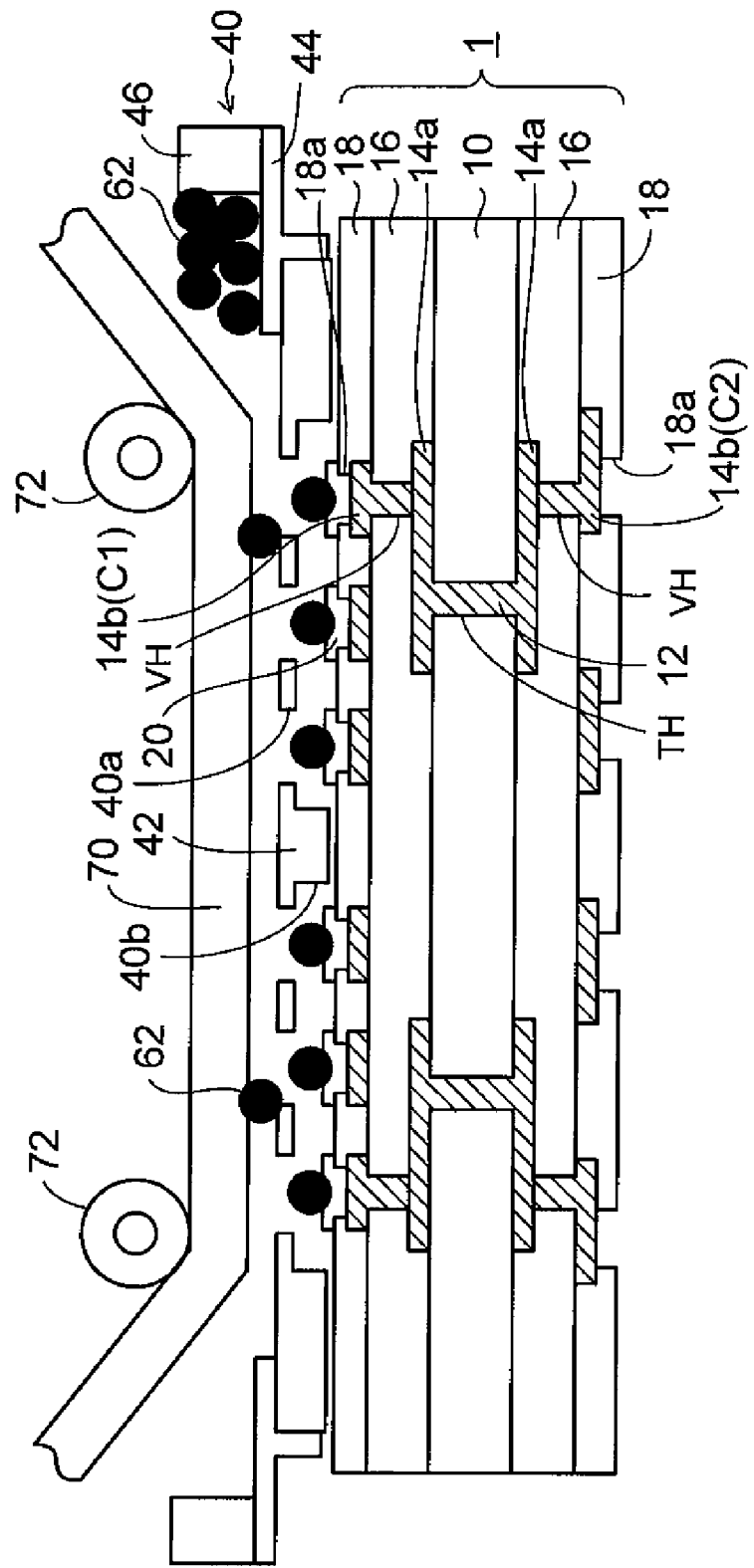
FIG. 7 is a cross-sectional view (No. 5) showing the method of mounting a conductive ball, according to the first embodiment of the present invention.
Figure 8:
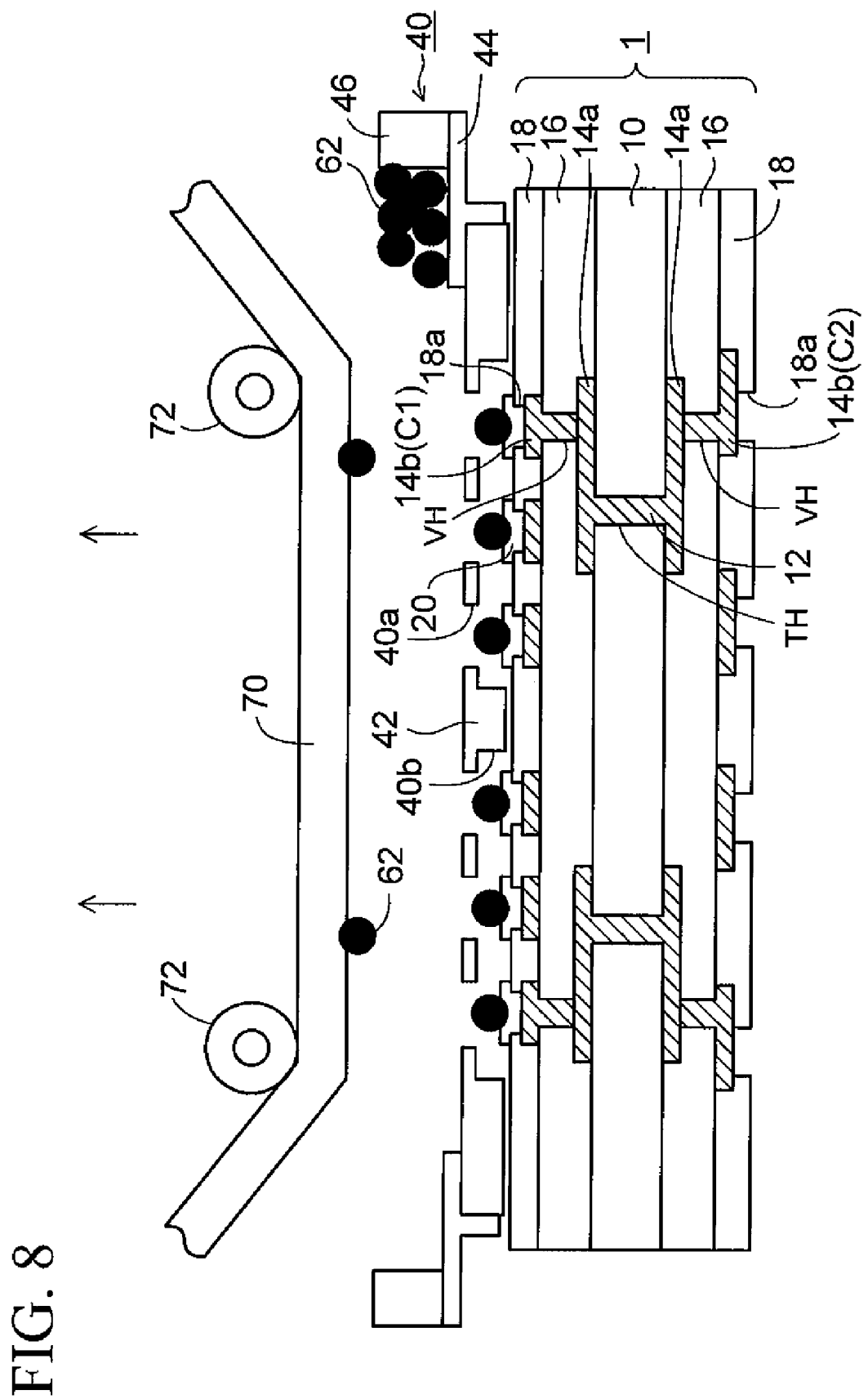
FIG. 8 is a cross-sectional view (No. 6) showing the method of mounting a conductive ball, according to the first embodiment of the present invention.

In consideration of this, in the first embodiment, as shown in FIG. 6, the adhesive film 70 placed under the two rollers 72 described above is moved toward the mask 40. Then, as shown in FIG. 7, the adhesive film 70 is disposed above the mask 40 while controlling the position in an extent that the adhesive film 70 does not come in contact with the mask 40, and the adhesive film 70 is made to abut onto the excess conductive balls 62 remaining on the mask 40. Thereby the excess conductive balls 62 are bonded to the adhesive film 70. Thereafter, as shown in FIG. 8, the excess conductive balls 62 are removed from the mask 40 by moving the adhesive film 70 on which the conductive balls 62 are bonded upward.

As described above, in the first embodiment, the conductive ball mounting apparatus 2 is provided with the adhesive film 70 disposed in parallel with the mask 40. Accordingly, although the excess conductive balls remain on the mask 40, the excess conductive balls 62 can be removed by the adhesive film 70 collectively.

Hence, unlike the prior arts, the excess conductive balls 62 can be removed collectively without repeating the movement of the brush 50 until no excess conductive balls 62 remain on the mask 40. Accordingly, the manufacturing efficiency can be remarkably improved. Moreover, unlike a method in which the conductive balls 62 are moved by blowing air, no conductive balls 62 can fly to the outside since the conductive balls are made to bond onto the adhesive film 70.

Note that, the conductive balls 62 which are moved to the one end side of the mask 40 are left thereon as it is, and are used as part of the conductive balls to be mounted on a wiring substrate which is processed next.

Figure 9:
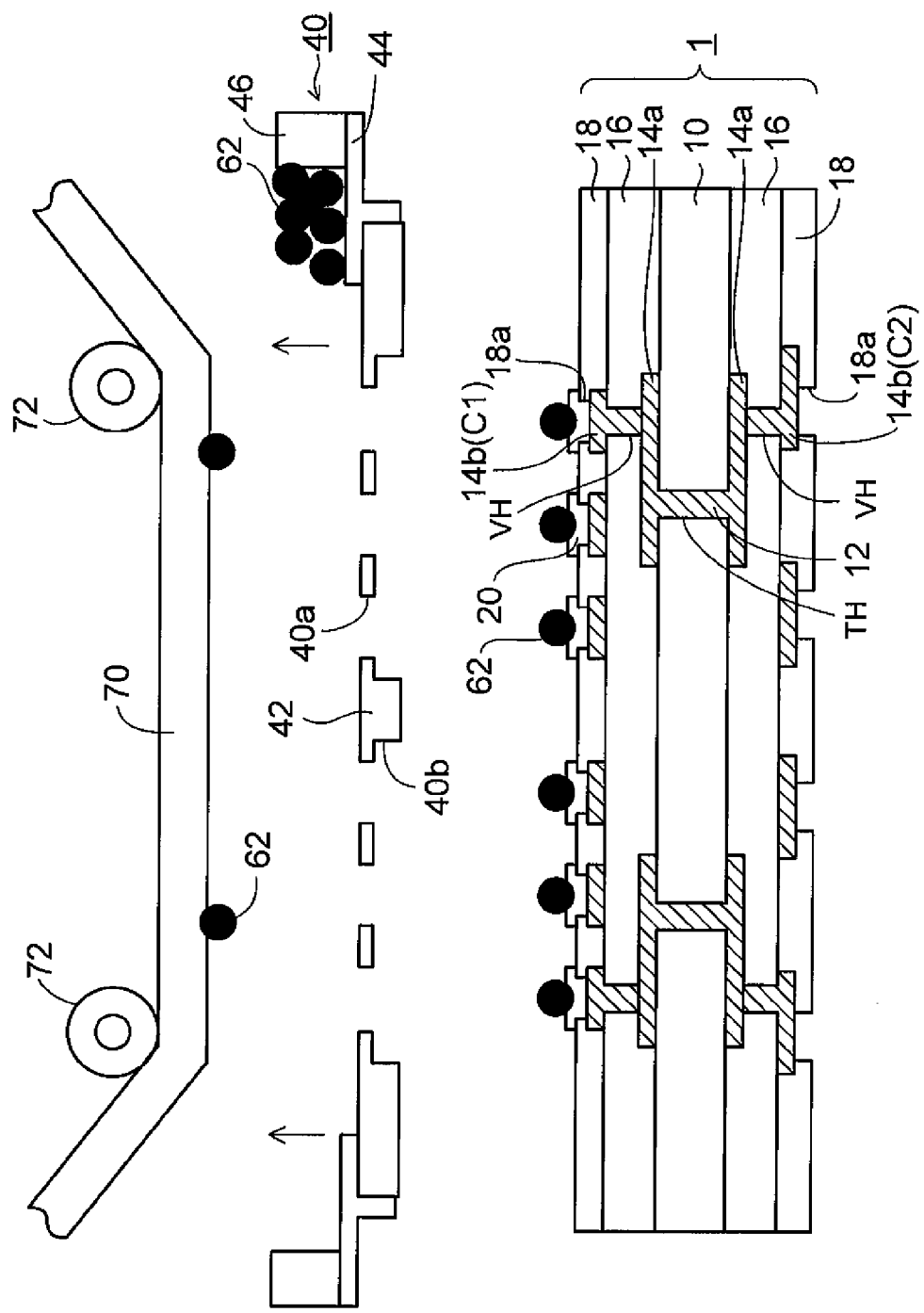
FIG. 9 is a cross-sectional view (No. 7) showing the method of mounting a conductive ball, according to the first embodiment of the present invention.

Subsequently, as shown in FIG. 9, after the adhesive film 70 is moved upward, the mask 40 is also moved upward, and is consequently removed from the wiring substrate 1. Then, the adhesive film 70 is wound by the reel (not illustrated) at the other end side, and the rollers 72 are rotated, thereby a new part of adhesive film 70 is placed under the two rollers 72.

Here, no excess conductive balls 62 are left around the opening portions 40a of the mask 40 when the mask 40 is separated from the wiring substrate 1. Hence, the problem that the plural conductive balls 62 are mounted on each of the connection pads C1 of the wiring substrate 1 is solved.

By this matter, one of the conductive balls 62 is arranged to bond to the flux 20 on each of the connection pads C1 of the wiring substrate 1 with high reliability. It should be noted that conductive balls can be mounted on the connection pads of the above-mentioned semiconductor wafer as well as the wiring substrate 1, by means of the same method.

Next, a method of mounting a semiconductor chip on the wiring substrate 1 on which the conductive balls 62 are mounted will be explained. As shown in FIG. 10, the conductive balls 62 (solder balls) are reflow-heated, then remaining fluxes are removed, thereby solder bumps 22 are obtained. Thereafter, as shown in FIG. 11, a semiconductor chip 80 having solder bumps 80a is prepared. The solder bumps 80a of the semiconductor chip 80 are placed on the solder bumps 22 of the wiring substrate 1, and they are flip-chip bonding by reflow-heating.

Thereby, as shown in FIG. 12, the solder bumps 22 of the wiring substrate 1 and the solder bumps 80a of the semiconductor chip 80 are respectively fused to form bump electrodes 24. Thus, the semiconductor chip 80 is electrically connected to the connection pads C1 of the wiring substrate 1 via the bump electrodes 24. In addition, solder balls or the like are mounted on the connection pads C2 on the lower surface of the wiring substrate 1 to form external connection terminals 26.

The timing at which the external connection terminals 26 are formed may be after the step shown in FIG. 10 (i.e. after the conductive balls 62 are mounted), or may be after the semiconductor chip 80 is mounted.

By this matter, a semiconductor device 3 according to the first embodiment is obtained. In a case where a large-sized substrate for multiple productions is used as the wiring substrate 1, the wiring substrate 1 is divided to be cut, before or after the semiconductor chip 80 is mounted.

As described above, in the method of mounting a conductive ball, according to the first embodiment, firstly, the conductive balls 62 are arranged on the connection pads C1 of the wiring substrate 1 through the opening portions 40a of the mask 40. Thereafter, before the mask 40 is separated upward to be removed from the wiring substrate 1, the excess conductive balls 62 remaining around the opening portions 40 of the mask 40 are bonded to the adhesive film 70, and are removed consequently.

Accordingly, since the excess conductive balls 62 on the mask 40 are removed by the adhesive film 70 collectively, the conductive balls 62 can be removed more efficiently and stably than a case of employing a method in which the excess conductive balls 62 are moved on the mask 40 by a brush or air.

Moreover, since no excess conductive balls 62 remain around the opening portions 40a of the mask 40, such a situation is prevented that the plural conductive balls 62 are mounted on each of the connection pads C1 of the wiring substrate 1. Accordingly, the conductive balls 62 can be mounted on the wiring substrate 1 with high reliability.

Second Embodiment

Figure 14:
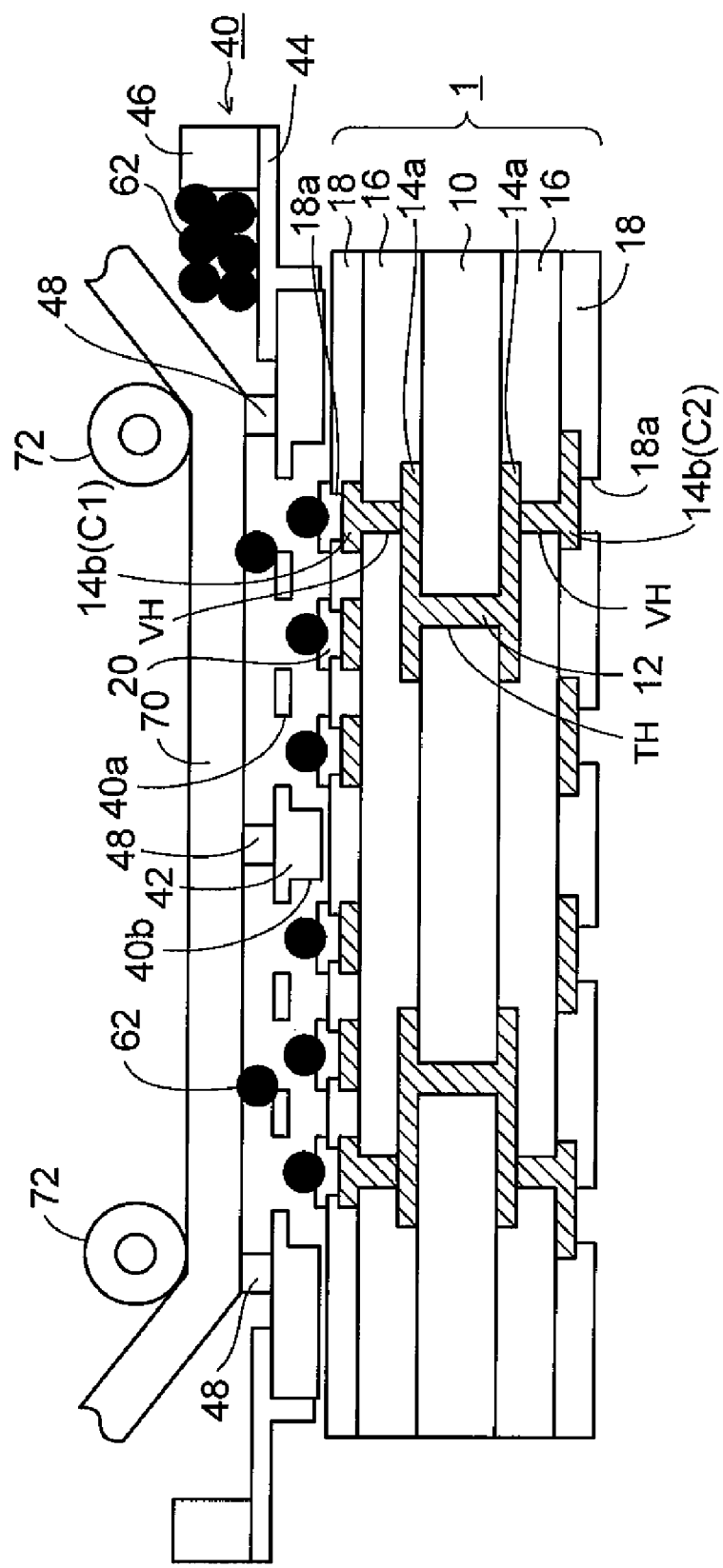
FIG. 14 is a cross-sectional view (No. 1) showing a method of mounting a conductive ball, according to a second embodiment of the present invention.
Figure 15:
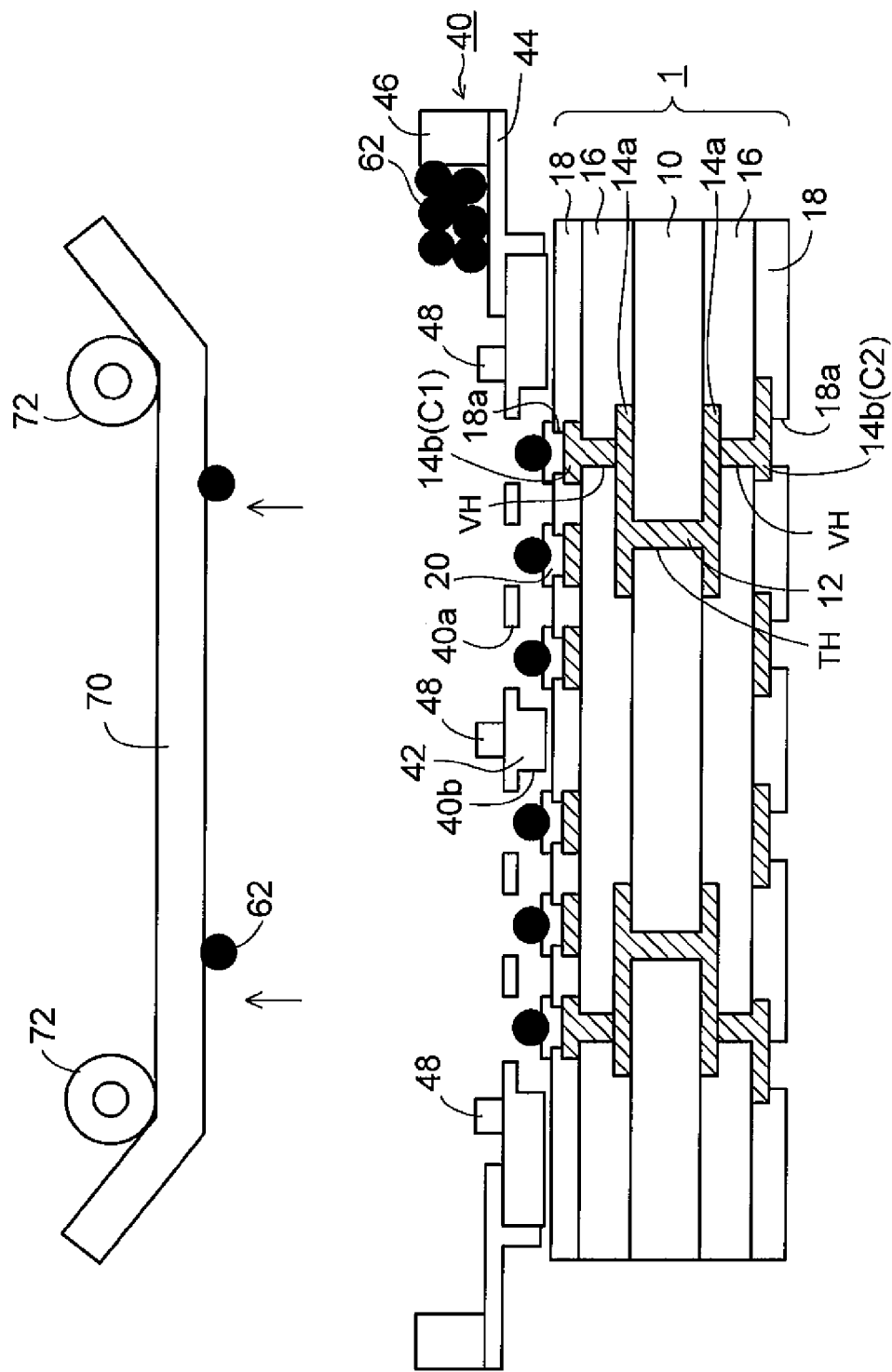
FIG. 15 is a cross-sectional view (No. 2) showing the method of mounting a conductive ball, according to the second embodiment of the present invention.

FIGS. 14 and 15 are cross-sectional views showing a method of mounting a conductive ball according to a second embodiment of the present invention. In the second embodiment, the same elements as those in the first embodiment are denoted by the same reference numerals, and the detailed description of those elements are omitted.

In the above-described method of mounting a conductive ball according to the first embodiment, by directly disposing the adhesive film 70 on the mask 40 which is flat while controlling the height position, the excess conductive balls 62 on the mask 40 are removed to be bonded to the adhesive film 70

By this matter, in the case where the adhesive film 70 is displaced toward the mask 40 and is consequently placed in contact with the mask 40, it is assumed that not only the excess conductive balls 62 on the mask 40 but also the conductive balls 62 transferred into the opening portions 40 of the mask 40 are removed to be bonded to the adhesive film 70 simultaneously.

To prevent this, in the second embodiment, as shown in FIG. 14, protrusion portions 48 which protrude upward are provided on the upper surface of the mask 40. Hence, the protrusion portions 48 serve as stoppers for the adhesive film 70, so that the adhesive film 70 is not placed lower than the upper surfaces of the protrusion portions 48.

The height of the protrusion portions 48 is set to be lower than the height (diameter) of the conductive balls 62. For example, when the height (diameter) of the conductive balls 62 is 100 μm, the height of the protrusion portions 48 is set to 20 μm to 50 μm. The adhesive film 70 can make the excess conductive balls 62 bond by abutting to only the excess conductive balls 62 that should be removed without coming in contact with the metal mask portion 42 of the mask 40.

Thereafter, as shown in FIG. 15, the adhesive film 70 is moved upward from the wiring substrate 1, so that the excess conductive balls 62 are removed from the mask 40, as in the first embodiment.

As described above, in the second embodiment, since the protrusion portions 48 for controlling the height position at which the adhesive film 70 is placed are provided on the mask 40, there is no possibility that the adhesive film 70 is displaced toward the mask 40. Accordingly, when the excess conductive balls 62 on the mask 40 are removed by the adhesive film 70, such a situation can be prevented that the conductive balls 62 transferred into the opening portions 40a of the mask 40 are removed simultaneously.

Figure 16:
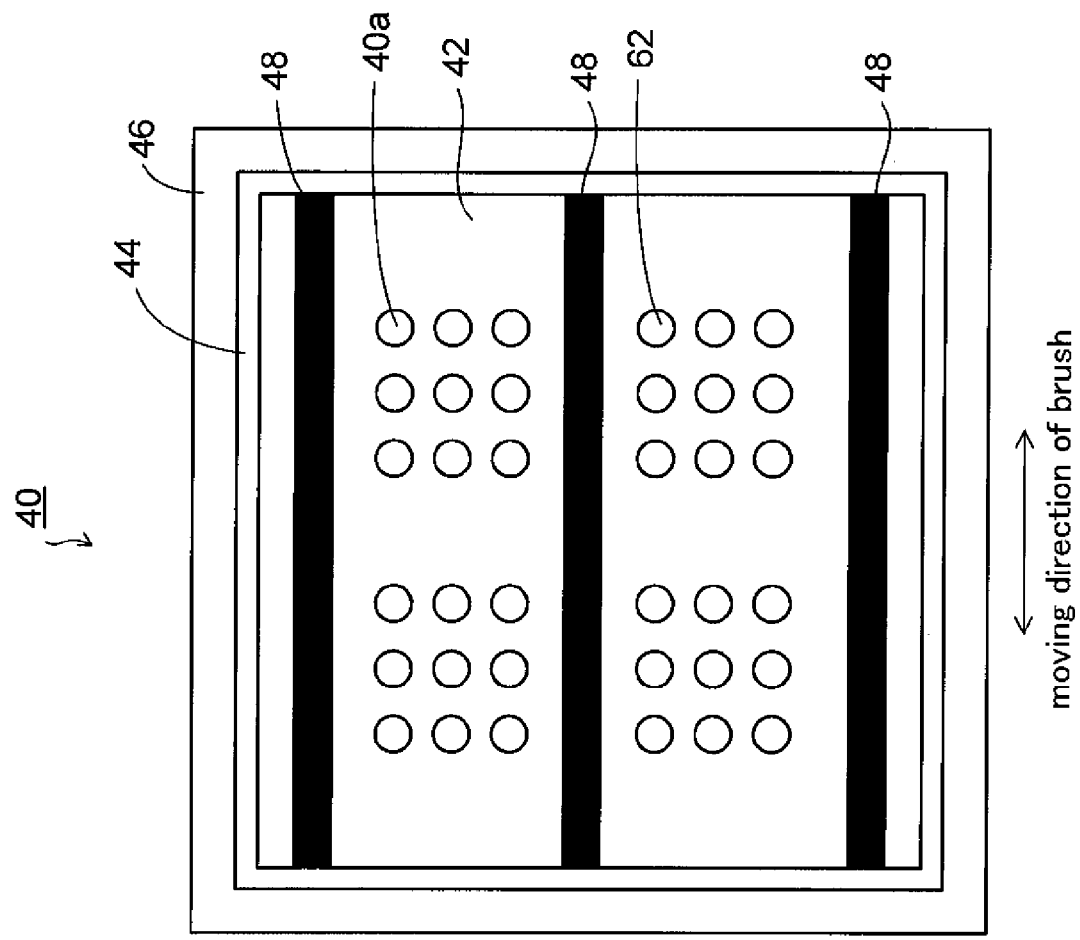
FIG. 16 is a plan view showing a state of a mask on which protrusion portions are provided, according to the second embodiment of the present invention.

FIG. 16 shows a state in which the mask 40 provided with the protrusion portions 48 is seen from the above. In the example shown in FIG. 16, the opening portions 40a of the mask 40 aligned with an area array type are arranged to be divided in four areas. The protrusion portions 48 are provided in belt-like shapes (in stripes) so as to partition the groups of opening portions 40a located upside and downside.

In other words, the protrusion portions 48 are each formed in a belt-like shape so as to extend in the same direction as the moving direction of the brush 50. Accordingly, the conductive balls 62 are swept to a longitudinal direction of the protrusion portions 48, and are moved to the one end side of the mask 40. Thus, there is no possibility that the protrusion portions 48 become obstacles when the conductive balls 62 are moved.

The protrusion portions 48 may be formed integrally with the metal mask portion 42 of the mask 40, or may be formed separately from the mask 40 to be disposed on the mask 40 as spacer parts.

Then, similarly to the first embodiment, after the mask 40 is moved upward from the wiring substrate 1 and is then removed in FIG. 15, the same steps as those shown in FIGS. 10 to 12 described above are performed. By this matter, a semiconductor chip is mounted on the wiring substrate 1 by flip-chip mounting, and a semiconductor device is composed.

The second embodiment provides the same effects as those of the first embodiment, and can improve the reliability when the excess conductive balls are removed by the adhesive film, compared to the first embodiment.

What is claimed is:

1. A method of mounting a conductive ball, comprising the steps of:
   disposing a mask on a substrate including connection pads, the mask having opening portions corresponding to the connection pads;
   supplying conductive balls on the mask;
   arranging the conductive balls on the connection pads of the substrate through the opening portions of the mask, by moving the conductive balls to one end side of the mask by a ball moving member; and
   placing a ball removal film at a predetermined height position, wherein the ball removal film is in contact with excess conductive balls remaining on a region of the mask where the opening portions are provided, the ball removal film does not contact the conductive balls on the connection pads of the substrate, and the ball removal film does not contact the conductive balls moved to the one end side of the mask by the ball moving member;
   removing the excess conductive balls remaining on the region of the mask where the opening portions are provided, by bonding the excess conductive balls to the ball removal film.

2. The method of mounting a conductive ball according to claim 1, wherein the ball removal film is any one of an adhesive film and an electrostatic adsorption film.

3. The method of mounting a conductive ball according to claim 1, wherein
   in the ball removal film,
   a roll-like film is pulled out to be placed in parallel with the mask, and
   after the conductive balls are removed to be bonded to the ball removal film, the ball removal film is wound, and a new part of the ball removal film is placed on the mask.

4. The method of mounting a conductive ball according to claim 1, wherein the substrate is any one of a wiring substrate for mounting a semiconductor chip, and a semiconductor wafer in which a semiconductor element is made.

5. The method of mounting a conductive ball according to claim 1, wherein a protrusion portion protruding upward is provided on an upper surface of the mask, and the ball removal film is placed on the protrusion portion, so that the height position of the ball removal film is controlled.

6. The method of mounting a conductive ball according to claim 5, wherein the protrusion portion is provided in a belt-like shape in the same direction as the moving direction of the ball moving member.

* * * * *